US012572139B2

(12) United States Patent
Kim et al.

(10) Patent No.: US 12,572,139 B2
(45) Date of Patent: Mar. 10, 2026

(54) METHOD FOR CONTACTLESS DIAGNOSING POWER FACILITY USING ARTIFICIAL INTELLIGENCE AND SIGNAL PROCESSING TECHNOLOGY AND DEVICE USING THE SAME

(71) Applicants: SIECOM CO., Ltd., Pyeongtaek-si (KR); Codevision Inc., Seoul (KR)

(72) Inventors: Junsik Kim, Pyeongtaek-si (KR); Eungyeol Song, Seoul (KR)

(73) Assignees: SIECOM CO., Ltd., Pyeongtaek-si (KR); Codevision Inc, Seoul (KR)

( * ) Notice: Subject to any disclaimer, the term of this patent is extended or adjusted under 35 U.S.C. 154(b) by 621 days.

(21) Appl. No.: 17/661,262

(22) Filed: Apr. 28, 2022

(65) Prior Publication Data

US 2023/0350401 A1 Nov. 2, 2023

(30) Foreign Application Priority Data

Apr. 28, 2022 (KR) ........................ 10-2022-0052503

(51) Int. Cl.
| | |
|---|---|
| *G05B 23/02* | (2006.01) |
| *G01R 31/12* | (2020.01) |
| *G06F 18/2131* | (2023.01) |
| *G06N 3/045* | (2023.01) |
| *G06N 3/0464* | (2023.01) |
| *G06N 3/09* | (2023.01) |

(52) U.S. Cl.
CPC ..... *G05B 23/0254* (2013.01); *G06F 18/2131* (2023.01); *G06N 3/0464* (2023.01); *G01R 31/1209* (2013.01); *G05B 23/0221* (2013.01); *G06N 3/09* (2023.01)

(58) Field of Classification Search
CPC ........... G05B 23/0254; G05B 23/0221; G06F 18/2131; G06N 3/0464; G06N 3/09; G01R 31/1209
See application file for complete search history.

(56) References Cited

FOREIGN PATENT DOCUMENTS

| | | | | |
|---|---|---|---|---|
| CN | 106546892 A | * | 3/2017 | ......... G01R 31/1209 |
| CN | 109856517 B | | 2/2021 | |

OTHER PUBLICATIONS

Liu et al., "Online recognition method of transformer partial discharge based on audio detection" AIP Advances 12, 015023 (2022) (Year: 2022).*

(Continued)

*Primary Examiner* — John C Kuan
(74) *Attorney, Agent, or Firm* — BROADVIEW IP LAW, PC

(57) ABSTRACT

Method for contactless diagnosing power facility using artificial intelligence and signal processing technology and device using the same is disclosed. According to an embodiment of the present disclosure, a method of diagnosing a power facility using artificial intelligence comprises acquiring an ultrasonic signal of the power facility, generating a mel spectrogram based on the ultrasonic signal, wherein the mel spectrogram including time information, frequency information, and magnitude information corresponding to the ultrasonic signal, and being in a form of an image, inputting the mel spectrogram into a pre-trained diagnostic model and acquiring diagnostic data for the power facility based on the diagnostic model, wherein the diagnostic model is based on a convolution neural network algorithm.

9 Claims, 15 Drawing Sheets

(56) References Cited

OTHER PUBLICATIONS

Kong et al., "Automatic Online Partial Discharge Diagnosis via Deep Learning" 2020 IEEE (Year: 2020).*
Zhang et al., "Fault Identification Based on PD Ultrasonic Signal Using RNN, DNN and CNN" 2018 IEEE (Year: 2018).*
Machine translation for CN-106546892-A, downloaded Feb. 2025 (Year: 2025).*
Ishak, Sanuri et al. (2021) "Fault Classification System for Switchgear CBM from an Ultrasound Analysis Technique Using Extreme Learning Machine," Energies 2021. DOI: 10.3390/en14196279.
Office Action for KR 10-2022-0052503 by Korean Intellectual Property Office dated Apr. 26, 2024.

* cited by examiner

10

100

MEMORY UNIT — CONTROL UNIT — COMMUNICATION UNIT 110          120          130

<u>200</u>

| MEMORY UNIT | CONTROL UNIT | COMMUNICATION UNIT |

210                220                230

300

| MEMORY UNIT | CONTROL UNIT | COMMUNICATION UNIT |

310                320                330

(a)

(b)

(c)

METHOD FOR CONTACTLESS DIAGNOSING POWER FACILITY USING ARTIFICIAL INTELLIGENCE AND SIGNAL PROCESSING TECHNOLOGY AND DEVICE USING THE SAME

CROSS-REFERENCE TO RELATED APPLICATION

This application claims priority to and the benefit of Korean Patent Application No. 10-2022-0052503, filed on Apr. 28, 2022, the disclosure of which is incorporated herein by reference in its entirety.

BACKGROUND

1. Field of the Invention

The present disclosure relates to a method for contactless diagnosing power facility using artificial intelligence and signal processing technology and device using the same.

2. Discussion of Related Art

In general, since power facilities such as overhead distribution lines, insulators, fuses, and switchgear may be damaged due to changes in the surrounding environment and defects or deterioration of facilities, management such as continuous inspection of power facilities, removal of safety hazard factors, and replacement of facilities is required.

In addition, various diagnostic methods have been used to diagnose failures in power facilities. Examples of the diagnostic methods include a distribution line patrol method of visually inspecting, by a distribution line patrol, a failure of a power facility, a method of riding a live line bucket truck and approaching a live line power facility in a live line condition to inspect each live line by measuring a shared voltage using visual inspection and a fork-type suspension insulator shared voltage meter, a measurement method using an optical camera to find defects in an exterior of a power facility, a thermal imaging camera measurement method for preventing a failure of power distribution lines by measuring heat generated when a power facility is deteriorating, and the like.

However, there is a problem in that diagnosis using such diagnostic methods takes much time and also requires high costs.

Therefore, recently, a diagnostic device using ultrasonic waves has been released, and a general power distribution facility disturbs the air molecules around it by arc, tracking, and corona phenomena, and thus, generates a unique ultrasonic signal that a person cannot hear.

Such an ultrasonic diagnostic device is equipment that transforms an ultrasonic signal into an acoustic signal within a human audible range so that a person may hear a sound through a headphone (or a speaker) and displays the ultrasonic signal in the form of a waveform that may be easily visually identified.

However, conventionally, there is a problem in that, as a diagnostician of a power facility listens to an acoustic signal and determines whether the power facility has failed, it takes a long time to diagnose a failure of the power facility, and the diagnosis accuracy may vary depending on the experience of the diagnostician.

Recently, research to solve these problems has been ongoing.

The present application was supported by Institute of Information & Communications Technology Planning & Evaluation (IITP) grant funded by the Korea government (MSIT) (No. 2021-0-01950, Development of a gradual failure Data Analysis System Using AI)

SUMMARY OF THE INVENTION

The present disclosure is directed to using artificial intelligence to reduce time required for failure diagnosis of a power facility and improve accuracy of the failure diagnosis.

Objects that are to be solved by the present disclosure are not limited to the above described objects, and objects that are not described will be clearly understood by those skilled in the art to which the present disclosure pertains from the present specification and the accompanying drawings.

According to an embodiment of the present disclosure, a method of diagnosing a power facility using artificial intelligence comprises acquiring an ultrasonic signal of the power facility, generating a mel spectrogram based on the ultrasonic signal, wherein the mel spectrogram including time information, frequency information, and magnitude information corresponding to the ultrasonic signal, and being in a form of an image, inputting the mel spectrogram into a pre-trained diagnostic model and acquiring diagnostic data for the power facility based on the diagnostic model, wherein the diagnostic model is based on a convolution neural network algorithm.

Technical solutions of the present disclosure are not limited to the above described solutions, and solutions that are not described will be clearly understood by those skilled in the art to which the present disclosure pertains from the present specification and the accompanying drawings.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
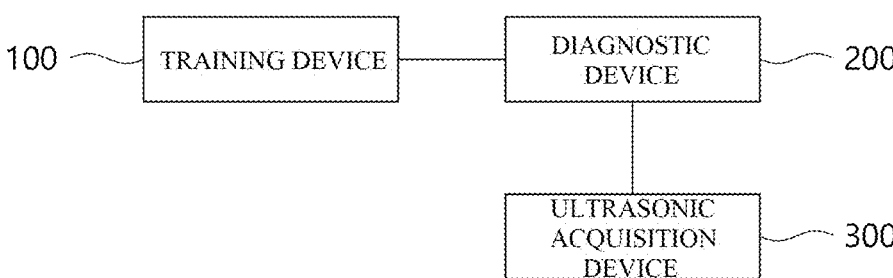
FIG. 1 is a diagram illustrating a failure diagnostic system according to an embodiment.

The above-described objects, features, and advantages of the present disclosure will become more obvious from the following detailed description provided in relation to the accompanying drawings. However, the present disclosure may be variously modified and have several exemplary embodiments. Therefore, specific exemplary embodiments of the present disclosure will be illustrated in the accompanying drawings and be described in detail.

In the drawings, thicknesses of layers and regions are exaggerated for clarity. In addition, when an element or a layer is referred to as being "on" another element or layer, the element is not necessarily directly on another element or layer but still another element or layer may be interposed therebetween. In principle, like reference numerals denote like constituent elements throughout the specification. Further, like reference numerals will be used to designate like components having similar functions throughout the drawings within the scope of the present disclosure.

When it is determined that a detailed description of known functions or configurations related to the present disclosure may obscure the gist of the present disclosure, such detailed description will be omitted. In addition, numbers (for example, first, second, etc.) used in the description of the present specification are merely identification symbols for distinguishing one element from other elements.

In addition, the terms "module" and "unit" for components used in the following description are used only for ease of description. Therefore, these terms do not have meanings or roles that distinguish the components from each other in themselves.

According to an embodiment of the present disclosure, a failure diagnostic system may be provided.

FIG. 1 is a diagram illustrating a failure diagnostic system according to an embodiment.

Referring to FIG. 1, a failure diagnostic system 10 may include a training device 100 that trains a diagnostic model, a diagnostic device 200 that performs a failure diagnosis of a power facility using the diagnostic model, and an ultrasonic acquisition device 300 that measures ultrasonic waves of the power facility. In addition, the ultrasonic acquisition device 300 may include an optical measurement unit capable of photographing a state of an exterior of a power facility and a temperature measurement unit (e.g., an infrared measurement unit) capable of measuring a temperature of the power facility. In addition, the ultrasonic acquisition device 300 may include a humidity measurement unit that measures a humidity of a power facility, a distance measurement unit that measures a distance from the power facility, a location acquisition unit that acquires location information of the ultrasonic acquisition device, and the like.

In addition, the failure diagnostic system 10 may include at least one or more of training devices 100, diagnostic devices 200, and ultrasonic acquisition devices.

The training device 100 may perform training of the diagnostic model. As an example, the training device 100 may perform training of a diagnostic model using a first training data set in which an ultrasonic signal measured when an arc occurs in a power facility is converted into input data, a second training data set in which the ultrasonic signal measured when tracking occurs in the power facility is converted into input data, a third training data set in which the ultrasonic signal measured when a corona occurs in the power facility is converted into input data, and a fourth training data set in which the ultrasonic signal measured when the power facility performs a normal operation is converted into input data. In this case, each of the first to third training data sets may be labeled for a failure occurring in the power facility. Also, the fourth training data set may be labeled as being normal.

Also, the input data included in the training data sets may have various formats. For example, the training device 100 may convert the ultrasonic signal into an image by performing visualization on the ultrasonic signal. For example, the training device 100 may convert the ultrasonic signal into a mel spectrogram to be described below, and use the mel spectrogram as input data. Also, in another example, the training device 100 may generate frequency data by applying a Fourier transform to the ultrasonic signal, and use the frequency data as input data.

Also, in this specification, diagnosing the failure of the power facility may include diagnosing whether the power facility operates normally or diagnosing a failure phenomenon occurring in the power facility.

The diagnostic device 200 may diagnose the failure of the power facility by using a diagnostic model. As an example, the diagnostic device 200 may diagnose the failure of the power facility by using the diagnostic model trained by the training unit.

In an embodiment, the diagnostic device 200 may be a handheld device such as a smart phone, a tablet, or a personal computer (PC), or a fixed device such as a computer or a server.

The ultrasonic acquisition device 300 may acquire the ultrasonic signal generated in the power facility and provide the ultrasonic signal (or ultrasonic data representing the ultrasonic signal) to the diagnostic device 200. Also, according to an embodiment, the ultrasonic acquisition device 300 may acquire the acquired ultrasonic signal as an acoustic signal in an audible frequency band that a human may hear, and provide the ultrasonic signal and/or the acoustic signal to the diagnostic device 200.

In the failure diagnostic system 10 according to the present embodiment, the training device 100 may acquire the training data set to perform the training of the diagnostic model, the ultrasonic acquisition device 300 may provide the ultrasonic signal to the diagnostic device 200, and the diagnostic device 200 may perform a failure diagnosis on the power facility using the ultrasonic signal acquired from the ultrasonic acquisition device 300 using the diagnostic model.

Also, in another embodiment, the training device 100 and the diagnostic device 200 may each be in the form of a server device. Also, the training device 100 and the diagnostic device 200 may be physically implemented as one device or one server device.

Further, in another embodiment, the diagnostic device 200 and the ultrasonic acquisition device 300 may be implemented as one device. Further, according to an embodiment, the training device 100, the diagnostic device 200, and the ultrasonic acquisition device 300 may be implemented as one device.

The failure diagnostic system disclosed herein is not limited to the above-described embodiments, and may be implemented in any form including the training device 100, the diagnostic device 200, and the ultrasonic acquisition device 300.

Figure 2:
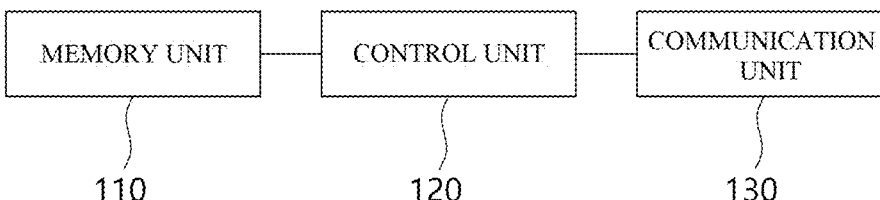
FIG. 2 is a block diagram for describing a training device according to an embodiment.

FIG. 2 is a block diagram for describing a training device according to an embodiment.

Referring to FIG. 2, the training device 100 may include a memory unit 110, a control unit 120, and a communication unit 130.

The control unit 120 may control the operation of the training device 100.

The control unit 120 may include one or more of a central processing unit (CPU), a random access memory (RAM), a graphics processing unit (GPU), one or more microprocessors, and other electronic components capable of processing input data according to a predetermined logic.

The control unit 120 may read a system program and various processing programs stored in the memory unit 110.

The training device 100 may include a memory unit 110. The memory unit 110 may store data required for training and the trained diagnostic model.

The memory unit 110 may be implemented as a nonvolatile semiconductor memory, a hard disk, a flash memory, a RAM, a read only memory (ROM), an electrically erasable programmable read-only memory (EEPROM), other tangible nonvolatile recording media, etc.

The memory unit 110 may store various processing programs, parameters for performing processing of the programs, the processing result data, etc.

Also, in an embodiment, the training device 100 may perform data processing and training. The control unit 120 may process or pre-process data for training in the data processing process. For example, the control unit 120 may process data using a predetermined data processing process program. Also, the control unit 120 may perform the training of the diagnostic model based on data processed in the training process. In an embodiment, the processed data may be in the form of an image, and in this case, the diagnostic model may be an image analysis-based diagnostic model (e.g., a convolution neural network (CNN)).

The communication unit 130 may perform communication with the external device. For example, the communication unit 130 may communicate with a diagnostic device and/or an ultrasonic acquisition device to be described below. The communication unit 130 may perform communication in a wired or wireless manner. The communication unit 130 may perform bi-directional or unidirectional communication.

Hereinafter, the data processing method and the characteristics and annotations (labeling) of each type of data according to the type of failure will be described.

Figure 3:
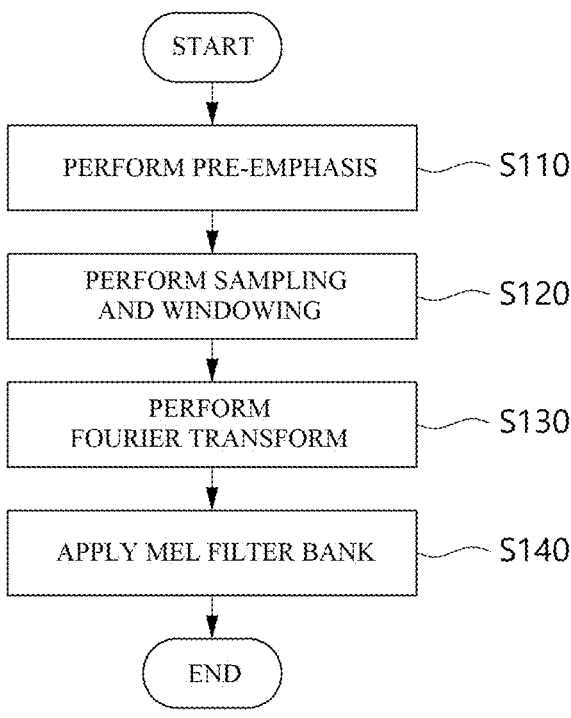
FIG. 3 is a diagram for describing a data processing method of a training device according to an embodiment.

FIG. 3 is a diagram for describing a data processing method of a training device according to an embodiment.

Referring to FIG. 3, the training device may perform pre-emphasis on the ultrasonic signal (S110). Here, the pre-emphasis may mean pre-strengthening a frequency in order to reduce the influence of noise in the ultrasonic signal. For example, the training device may emphasize amplitude of a high frequency component in order to reduce the influence of noise at a high frequency.

In addition, the training device may sample the ultrasonic signal on which pre-emphasis has been performed (S120). For example, the training device may perform sampling of the ultrasonic signal, on which the pre-emphasis has been performed, at a frequency of 16 kHz in the range of −1.0 to 1.0. Of course, such sampling may be performed at various frequencies, such as 32 kHz.

Also, in step S120, the training device may frame the ultrasonic signal by applying windowing to the sampled ultrasonic signal. Applying windowing in this way may serve to minimize discontinuity at the beginning and the end of each frame. For example, the training device may generate a plurality of frames by applying windows of 0.96 seconds and hops of 0.48 seconds to the sampled ultrasonic signal. In addition, the training device may generate a plurality of frames using the Hamming window technique for the sampled ultrasonic signal. Of course, in addition to the training device, various window techniques (rectangular window, B-spline window, Welch window, sine window, cosine-sum windows (e.g., a Blackman window, etc.), adjustable windows (e.g., a Gaussian window, a confined Gaussian window), hybrid windows (e.g., a Bartlett-Hann window, etc.)) may be used to generate a plurality of frames.

Also, the training device may perform a Fourier transform on the generated frames (S130). The frames generated in step S120 may include a discrete time domain, and the training device may perform a discrete Fourier transform operation on the acoustic signal through a fast Fourier transform (FFT) algorithm, thereby obtaining frequency data. In addition, the training device may acquire frequency data through a short time Fourier transform (STFT) algorithm for the acoustic signal. Also, the training device may generate a power spectrum by squaring a magnitude component for frequency data, and may generate a log spectrum by applying a log scale to the magnitude component of the power spectrum. In addition, the training device may generate a spectrogram by combining the log spectrum for each frame. Such a spectrogram may have three-dimensional information (time, frequency, magnitude). For example, in the spectrogram, an x-axis may represent time information (frames), a y-axis may represent a frequency, and a z-axis (e.g., color) may represent a magnitude (decibels).

In addition, the training device may apply a mel filter bank to the spectrogram (S140). Depending on the application of the mel filter bank, a spectrometer may be converted into a mel scale. Accordingly, as the frequency of the spectrometer is converted into a mel frequency, and power at each point is converted based on a logarithm, the mel spectrogram may be generated. The mel spectrogram may reflect a characteristic that a human auditory organ is sensitive to frequency changes at low tones and less sensitive to frequency changes at high tones.

The training device may perform the training of the diagnostic model using the mel spectrogram according to the data processing method described above.

In addition, the above-described data processing method may be used to diagnose a failure of a power facility in the diagnostic device as well as the training device.

FIGS. 4 to 7 are diagrams for describing characteristics of each type of data according to a type of failure according to an embodiment.

A failure of the power facility may be diagnosed in the diagnostic model based on the characteristics of each type of data according to the type of failure described in FIGS. 4 to 7.

Figure 4:
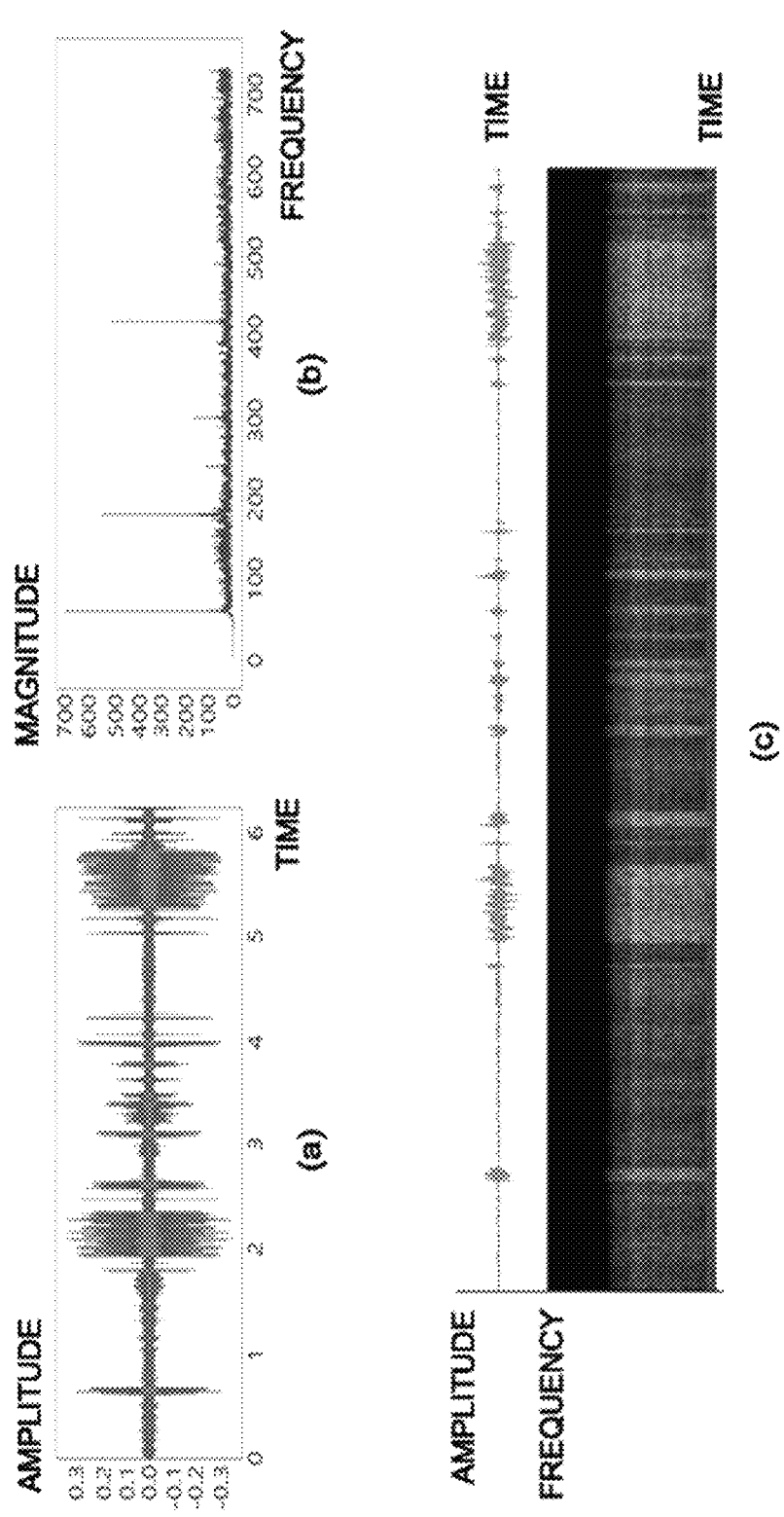
FIGS. 4 to 7 are diagrams for describing characteristics of each type of data according to a type of failure according to an embodiment.
Figure 5:
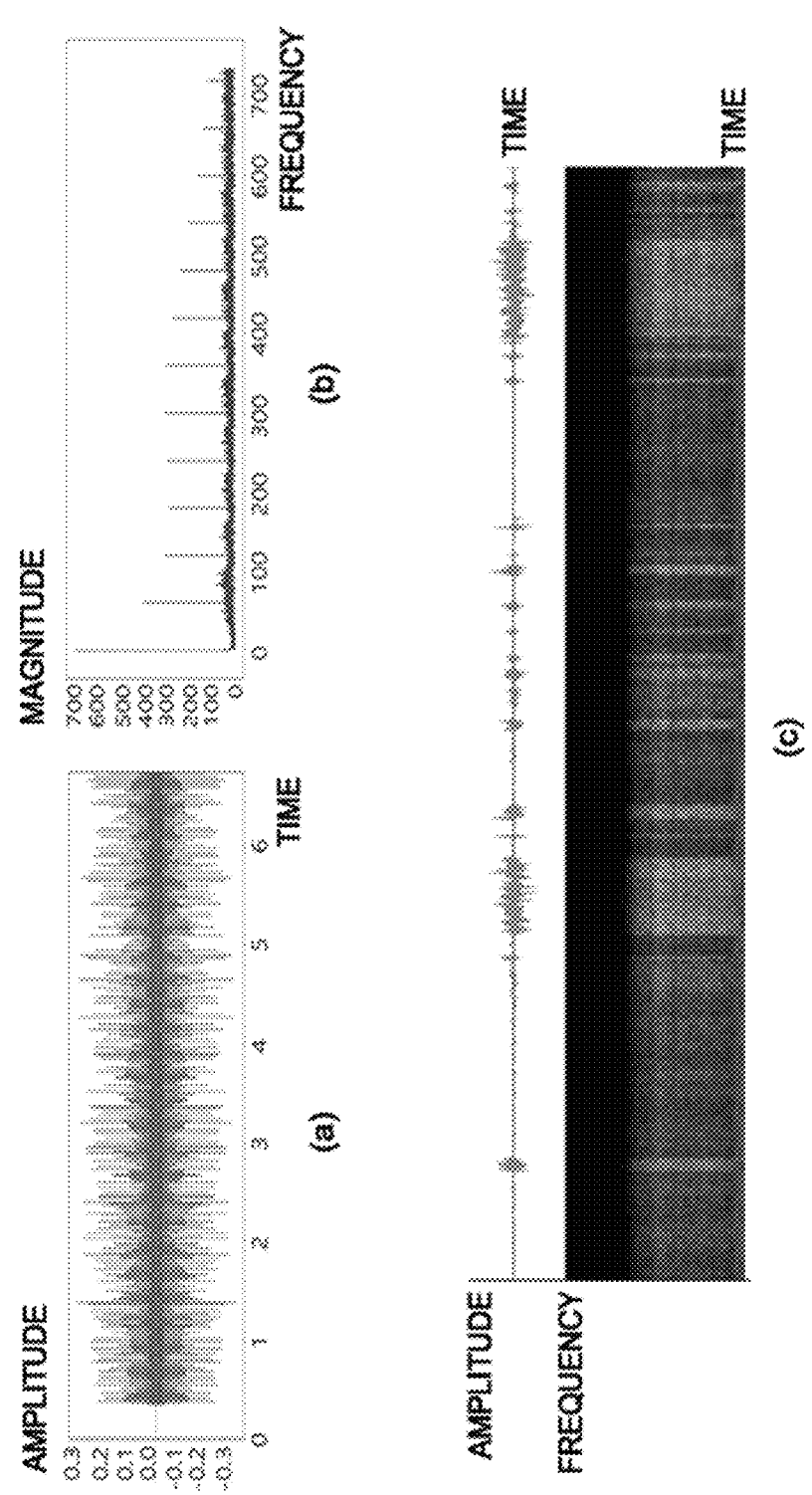
Figure 6:
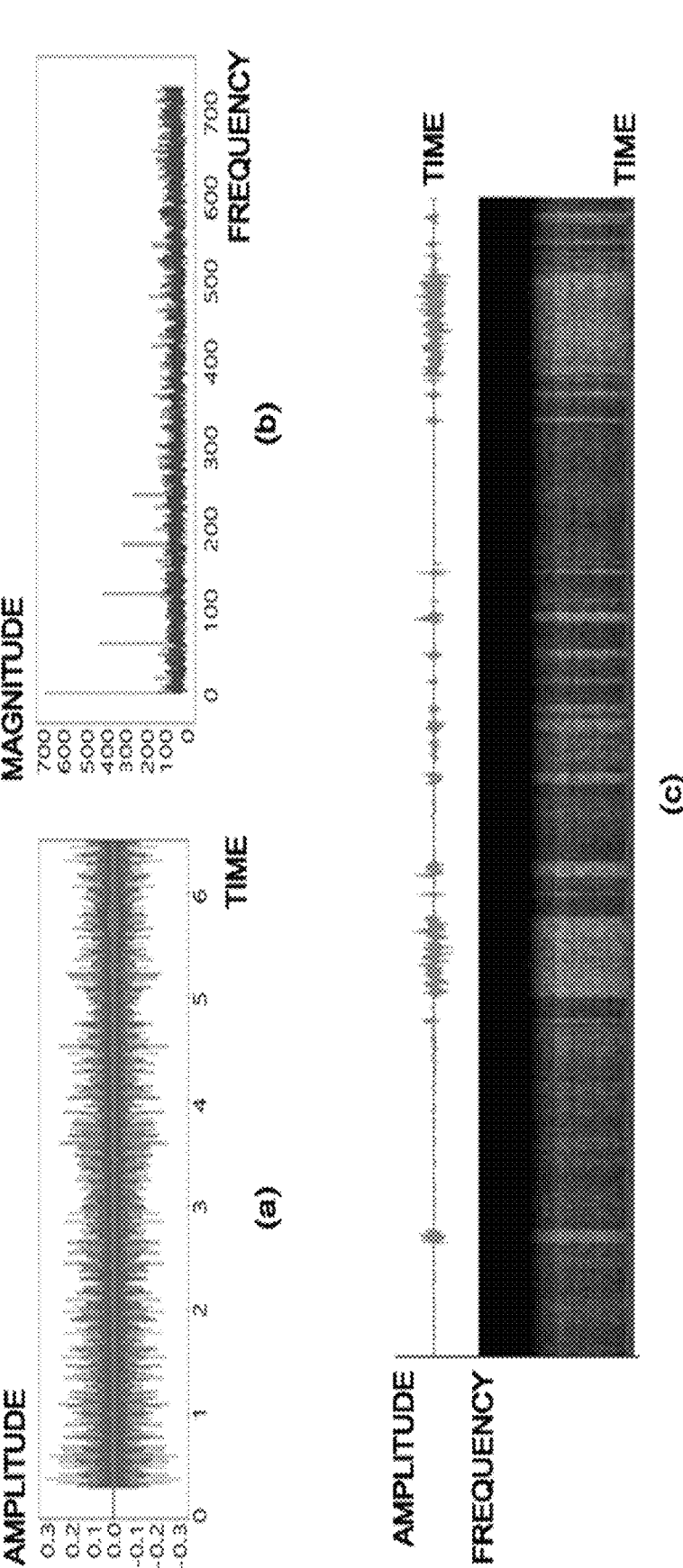

In FIGS. 4 to 6, FIGS. 4A, 5A, and 6A illustrate the waveform of the sampled ultrasonic signal, FIGS. 4B, 5B, and 6B illustrate a power spectrum, and FIGS. 4C, 5C, and 6C illustrate the mel spectrogram and the waveform of the ultrasonic signal corresponding to the mel spectrogram. The x-axis of the waveform in FIGS. 4A, 5A, and 6A may represent time and the y-axis may represent amplitude, the x-axis of the power spectrum in FIGS. 4B, 5B, and 6B may represent frequency and the y-axis may represent magnitude, and the x-axis of the mel spectrogram in FIGS. 4C, 5C, and 6C may represent time, the y-axis may represent frequency, and the z-axis (e.g., color) may represent magnitude (decibels). Also, in FIGS. 4C, 5C, and 6C, the x-axis of the waveform of the ultrasonic signal corresponding to the mel spectrogram may represent time, and the y-axis may represent amplitude.

Referring to FIG. 4, FIG. 4 may illustrate characteristics for each type of data when an arc occurs in a power facility.

When an arc occurs in the power facility, an abnormal explosion sound (erratic burst) having a sudden start and stop of energy may be generated in the power facility. Accordingly, the waveform of the ultrasonic signal in FIG. 4A may include a number of values that change more suddenly than an average band. Also, the amplitude of the waveform may increase when an arc occurs.

In addition, in the power spectrum in FIG. 4B, a harmonic component of 60 Hz may appear at a low frequency. In addition, in the mel spectrogram in FIG. 4C, the moment when a failure signal sound is generated may be divided into a band shape. In addition, the frequency may be higher than that of the normal signal sound, and the number of decibels may appear relatively high.

Referring to FIG. 5, FIG. 5 may illustrate characteristics for each type of data when a corona occurs in a power facility. When the corona occurs in the power facility, it may be a continuous buzzing sound in the power facility. Accordingly, in the waveform of the ultrasonic signal in FIG. 5A, it has a somewhat higher peak than the average band, and a constant frequency band may be generated. Also, waveforms of a rather large amplitude may be continuously generated.

In addition, in the power spectrum in FIG. 5B, a harmonic component of 60 Hz may appear at a low frequency. In addition, the higher the severity of the corona that occurs in the power facility, the more the magnitude of the harmonic component of 60 Hz tends to decrease gradually. In addition, although it may be distinguished from noise in the mel spectrogram in FIG. 5C, a thinner band shape may be generated than when the arc occurs in the power facility.

Referring to FIG. 6, FIG. 6 may illustrate characteristics for each type of data when tracking occurs in a power facility. When the tracking occurs in the power facility, a rather small explosion and/or buzzing sound accompanied by noise may be generated in the power facility. Accordingly, the waveform of the ultrasonic signal in FIG. 6A may have a high peak. In addition, in the power spectrum in FIG. 6B, a harmonic component of 60 Hz appears, but the magnitude of the harmonic component of 60 Hz gradually decreases, and a constant pattern may not appear. In addition, in the mel spectrogram in FIG. 6C, a cycle may be shorter than the case in which the corona occurs in the power facility, and the number of decibels may be high as a whole.

Figure 7:
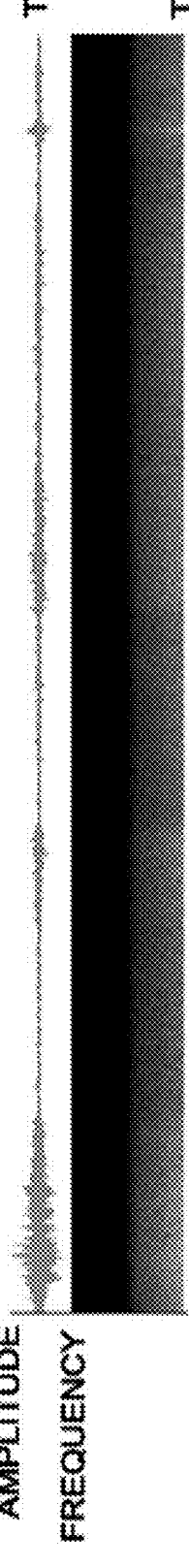

Referring to FIG. 7, FIG. 7 may illustrate a mel spectrogram and a waveform of an ultrasonic signal corresponding to the mel spectrogram when a failure does not occur in the power facility and is operation is normal. In the mel spectrogram of FIG. 7, the x-axis may represent time, the y-axis may represent frequency, and the z-axis (e.g., color) may represent magnitude (decibels). The x-axis of the waveform of the ultrasonic signal corresponding to the mel spectrogram may represent time, and the y-axis may represent amplitude.

When the power facility operates normally, the amplitude of the waveform of the ultrasonic signal increases according to the magnitude of the noise, and the characteristics of the specific frequency may not appear in the power spectrum. In addition, in the mel spectrogram as illustrated in FIG. 7, a distinct band shape does not appear compared to the amplitude, and a blurry signal cycle may be exhibited as a whole.

Figure 8:
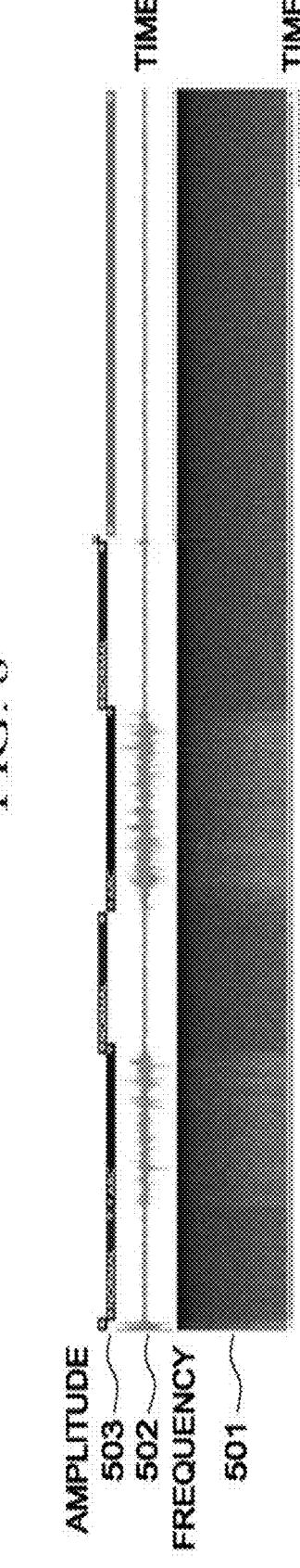
FIG. 8 is a diagram for describing an annotation tool for an ultrasonic signal according to an embodiment.

FIG. 8 is a diagram for describing an annotation tool for an ultrasonic signal according to an embodiment.

Referring to FIG. 8, FIG. 8 may illustrate a user interface (UI) of the annotation tool. A training device or a device (e.g., a PC, mobile, etc.) (or the above-described local device) capable of annotating (or labeling) the ultrasonic signal may provide the annotation tool as illustrated in FIG.

8. Hereinafter, it will be described that the annotation tool is executed in the training device for convenience, but the present disclosure is not limited thereto, and the annotation tool may be executed in various devices.

Specifically, upon receiving the ultrasonic signal, the training device may display a mel spectrogram 501 provided through the above-described data processing method and a waveform 502 of the ultrasonic signal through the UI of the annotation tool. Also, the training device may provide a labeling item 503. The training device may receive a selection from an operator of a type of a labeling item 503 for the state of the power facility such as normal operation, arc, corona, and tracking. In addition, the type of the labeling item 503 may include two types of a normal state and a failure state. In addition, the type of the labeling item 503 may include two or more sub-types such as the arc and failure states.

In addition, the position, length, etc., of each labeling item 503 may be selected by the operator. In addition, in an embodiment, the training device may analyze the waveform and/or mel spectrogram of the ultrasonic signal to preset the position and length of each labeling item 503, and display each labeling item 503, in which the position and length are set, on the UI of the annotation tool.

When the type, position, and/or length of each labeling item 503 is set, the training device may divide the ultrasonic signal according to the position and length of each labeling item 503 and separately store the divided ultrasonic signal according to the type of each labeling item 503. Accordingly, the training device may independently store and manage original data (a divided ultrasonic signal) corresponding to each labeling item 503, purified data (a waveform, power spectrum, mel spectrogram, etc. corresponding to the divided ultrasonic signal), and the labeling data in which the labeling item 503 is added to the original data and the purified data. In addition, the training device may perform the training of the diagnostic model using the labeling data.

In this way, the mel spectrogram and waveform of the ultrasonic signal are automatically provided through the annotation tool, and as the labeling may be performed according to the labeling item 503, the operator performing the annotation operation may more conveniently perform the annotation on the input data.

Figure 9:
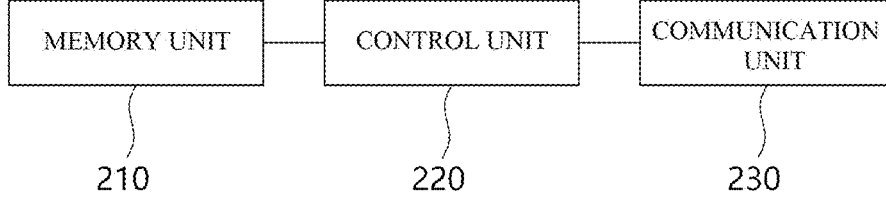
FIG. 9 is a block diagram for describing a diagnostic device according to an embodiment.

FIG. 9 is a block diagram for describing a diagnostic device according to an embodiment.

Referring to FIG. 9, the diagnostic device 200 may include a memory unit 210, a control unit 220, and a communication unit 230.

The control unit 220 may generate diagnostic data by using the diagnostic model. The control unit 220 may acquire frequency data for diagnosis and acquire diagnostic data on whether the power facility has failed by using the trained diagnostic model.

The control unit 220 may include one or more of a CPU, a RAM, a GPU, one or more microprocessors, and other electronic components capable of processing the input data according to a predetermined logic.

Also, in an embodiment, the control unit 220 may perform data processing and diagnosis. The control unit 220 may process or pre-process the ultrasonic signal acquired from the ultrasonic acquisition device. For data processing, since the data processing method of the training device described in FIG. 3 may be applied without change, a detailed description thereof will be omitted.

Also, the control unit 220 may perform a diagnosis on the power facility by using the processed data and the diagnostic model.

Also, the memory unit 210 may store the trained diagnostic model. The memory unit 210 may store a data processing process program, a diagnostic process program, parameters of a diagnostic model, variables, and the like for performing diagnostic assistance. The control unit 220 may perform a diagnosis on the power facility by using the stored diagnostic model.

In addition, the memory unit 210 may be implemented as a nonvolatile semiconductor memory, a hard disk, a flash memory, a RAM, a ROM, an EEPROM, other tangible nonvolatile recording media, etc.

The communication unit 230 may communicate with the training device and/or the ultrasonic acquisition device. As an example, the diagnostic device 200 may be provided in the form of a server communicating with the ultrasonic acquisition device.

Also, according to an embodiment, the failure diagnostic system may include at least one server device.

The server device may store and/or drive the diagnostic model. The server device may store weight values constituting the trained diagnostic model. In addition, the server device may collect or store data used for diagnosis.

The server device may output a result of the diagnostic assistance process using the diagnostic model to an external device and acquire feedback from the external device. The server device may operate similarly to the diagnostic device described above.

Figure 10:
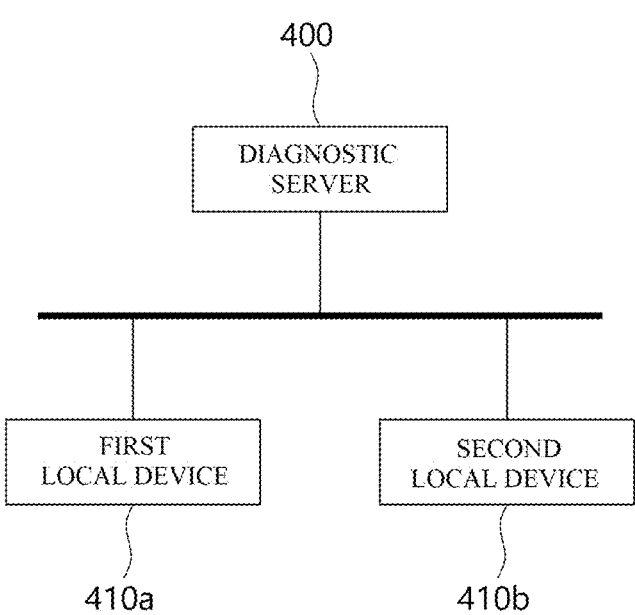
FIG. 10 is a diagram illustrating a failure diagnostic system according to another embodiment.

FIG. 10 is a diagram illustrating a failure diagnostic system according to another embodiment.

Referring to FIG. 10, a failure diagnostic system 20 according to an embodiment of the present disclosure may include a diagnostic server 400, a first local device 410*a*, and a second local device 410*b*.

The diagnostic server 400 may be the diagnostic device of the present specification implemented in the form of a server. The diagnostic server 400 may include a pre-trained diagnostic model.

The first local device 410*a* and the second local device 410*b* may be devices that are easy for operators to use, such as mobile devices, PCs, and tablets. Also, an application that may access the diagnostic server 400 is installed on the first local device 410*a* and the second local device 410*b*, and may communicate with the diagnostic server 400 through the application.

Also, the first local device 410*a* may communicate with a first ultrasonic acquisition device (not illustrated) and acquire a first ultrasonic signal of the first power facility from the first ultrasonic acquisition device (not illustrated). Also, the second local device 410*b* may communicate with a second ultrasonic acquisition device (not illustrated) and acquire a second ultrasonic signal of the second power facility from the second ultrasonic acquisition device (not illustrated).

The diagnostic server 400 may acquire the first ultrasonic signal and the second ultrasonic signal from each of the first local device 410*a* and the second local device 410*b*, use the diagnostic model to generate the first ultrasonic signal corresponding to the first ultrasonic signal and the second diagnostic data corresponding to the second ultrasonic signal, provide the first diagnostic data to the first local device 410*a*, and provide the second diagnostic data to the second local device 410*b*.

Also, according to an embodiment, the pre-trained diagnostic model may be included in each of the first local device 410*a* and the second local device 410*b*. In this case, the first local device 410*a* may generate the first diagnostic data corresponding to the first ultrasonic signal using the diagnostic model, the second local device 410*b* may generate the second diagnostic data corresponding to the second ultrasonic signal using the diagnostic model, and the diagnostic server 400 may acquire the first diagnostic data and the second diagnostic data from the first local device 410*a* and the second local device 410*b*.

In this way, the diagnostic server 400 may acquire diagnostic data of the first and second diagnostic facilities located in different regions through communication with the first local device 410*a* and the second local device 410*b*, thereby monitoring and managing the state of the first diagnostic facility and the second diagnostic facility. For example, the diagnostic server 400 may periodically collect the first diagnostic data and the second diagnostic data, thereby performing history management for the first diagnostic facility and the second diagnostic facility.

Figure 11:
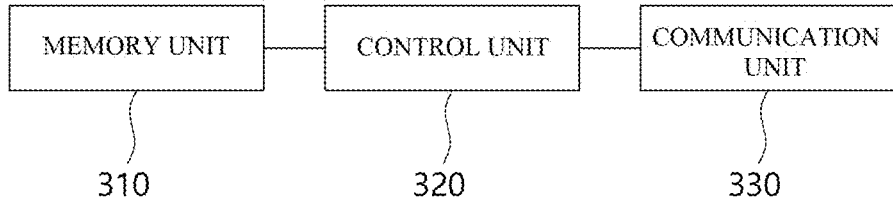
FIG. 11 is a block diagram for describing an ultrasonic acquisition device according to an embodiment.

FIG. 11 is a block diagram for describing an ultrasonic acquisition device according to an embodiment.

Referring to FIG. 11, an ultrasonic acquisition device 300 according to an embodiment of the present disclosure may include a memory unit 310, a control unit 320, and a communication unit 330.

The control unit 320 may acquire frequency data for a power facility. In an embodiment, the control unit 320 may include an ultrasonic sensor. The ultrasonic sensor may acquire the ultrasonic signal of the power facility. Also, the control unit 320 may obtain an acoustic signal by converting an ultrasonic signal into an audible frequency band, and may acquire frequency data by converting the acoustic signal into a frequency domain. The control unit 320 may transmit the ultrasonic signal, the acoustic signal, and/or the frequency data to the diagnostic device or the above-described server device through the communication unit 330.

The control unit 320 may include one or more of a CPU, a RAM, a GPU, one or more microprocessors, and other electronic components capable of processing the input data according to a predetermined logic.

The memory unit 310 may store various processing programs, parameters for performing processing of the programs, the processing result data, etc. For example, the memory unit 310 may store the ultrasonic signal, the acoustic signal, and/or the frequency data.

In addition, the memory unit 310 may be implemented as a nonvolatile semiconductor memory, a hard disk, a flash memory, a RAM, a ROM, an EEPROM, other tangible nonvolatile recording media, etc.

The communication unit 330 may communicate with an external device, for example, a diagnostic device or a server device. The communication unit 330 may perform communication in a wired or wireless manner.

Although not illustrated, the ultrasonic acquisition device may further include an output unit. The output unit may include a display that outputs a video or image, or a speaker that outputs audio. The output unit may output an acoustic signal through a speaker or may output a video expressing the acoustic signal through a display.

Although not illustrated, the ultrasonic acquisition device may further include an input unit. The input unit may acquire a user input.

In addition, although not illustrated, the ultrasonic acquisition device may include an optical measurement unit capable of photographing the state of the exterior of the power facility and a temperature measurement unit (e.g., an infrared measurement unit) capable of measuring the temperature of the power facility.

Figure 12:
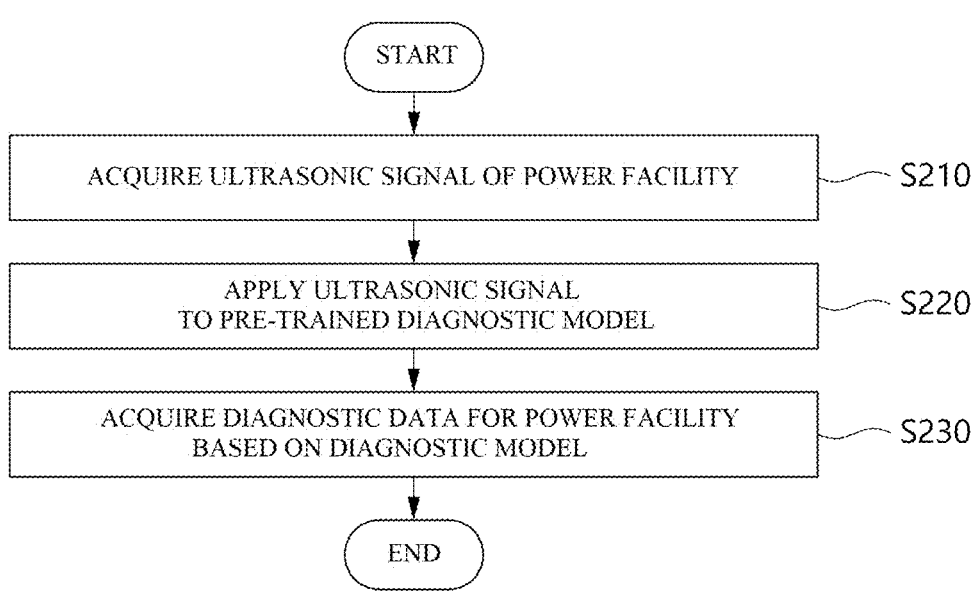
FIG. 12 is a diagram illustrating a diagnostic method of a diagnostic device according to an embodiment.

FIG. 12 is a diagram illustrating a diagnostic method of a diagnostic device according to an embodiment.

Referring to FIG. 12, the diagnostic method of the diagnostic device includes acquiring an ultrasonic signal of a power facility (S210), applying the ultrasonic signal to a pre-trained diagnostic model (S220), and applying diagnostic data for the power facility based on the diagnostic model.

In step S210, the diagnostic device may acquire the ultrasonic signal of the power facility. As described above, the ultrasonic signal may have a waveform shape. As an example, the diagnostic device may acquire the ultrasonic signal from the above-described ultrasonic acquisition device.

In addition, the diagnostic device may perform the data processing on the ultrasonic signal. For the data processing of the ultrasonic signal, since the data processing method of the training device described in FIG. 3 may be applied without change, a detailed description thereof will be omitted. According to the data processing method, the diagnostic device may acquire the mel spectrogram based on the ultrasonic signal.

In addition, in step S220, the diagnostic device may input data, in which the ultrasonic signal is processed, to the pre-trained diagnostic model as the input data. For example, the diagnostic device may input the mel spectrogram into the pre-trained diagnostic model. The mel spectrogram may be an image having three-dimensional information (time, frequency, and magnitude). Accordingly, the diagnostic model may be a neural network (e.g., a CNN) capable of performing image analysis.

As a specific example, the diagnostic model may be generated based on a depthwise-separable convolution neural network (depthwise-separable CNN) algorithm.

Figure 13:
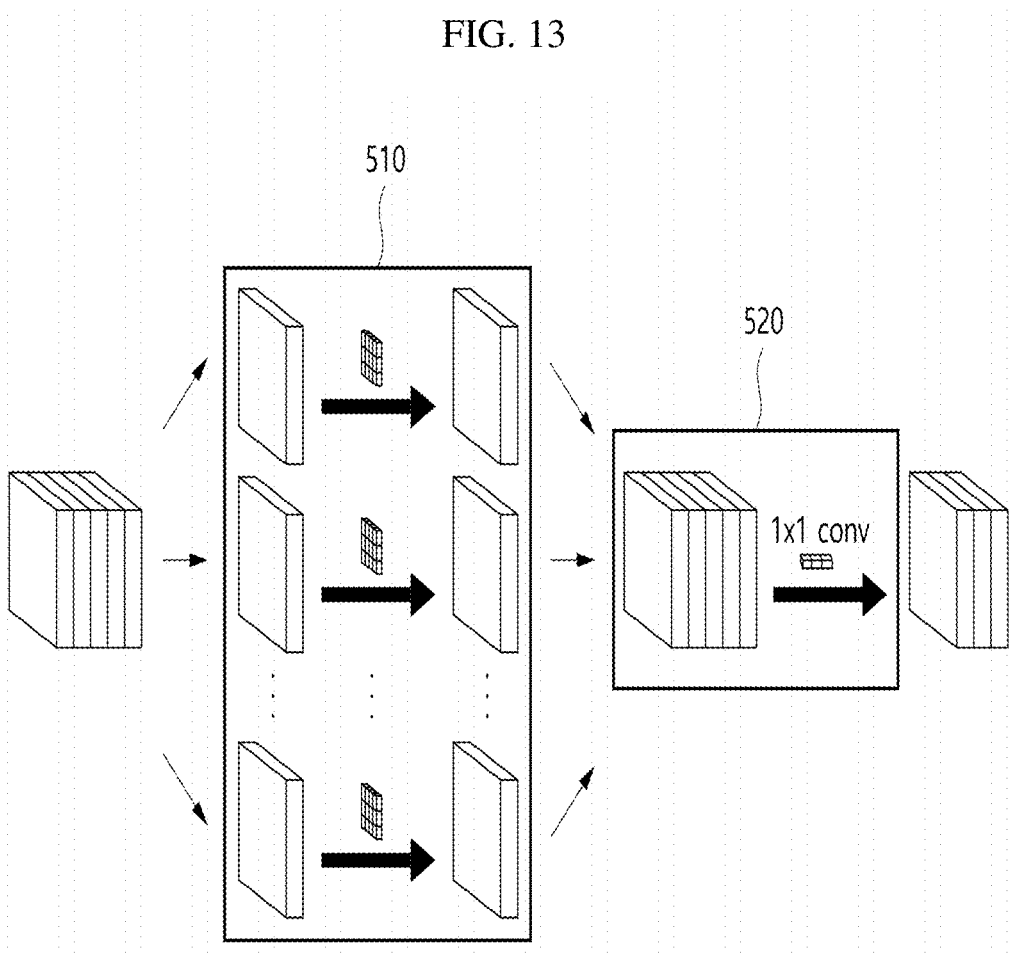
FIG. 13 is a diagram for describing a structure of a neural network of a diagnostic model according to an embodiment.

Describing the depthwise separable CNN with reference to FIG. 13, FIG. 13 is a diagram for describing a structure of a neural network of a diagnostic model according to an embodiment.

Referring to FIG. 13, the diagnostic device may input the mel spectrogram to the diagnostic model. In this case, the neural network of the diagnostic model may include a depthwise convolution layer 510 and a pointwise convolution layer 520. In addition, each of the depthwise convolution layer and the pointwise convolution layer may include at least one sub-layer. Each layer included in the diagnostic model may be processed sequentially. For example, a first layer may generate an intermediate output for an input, and the intermediate output generated in the first layer may become an input of a second layer, so the intermediate output may be processed in the second layer.

The diagnostic model may separate the input mel spectrogram for each channel. For example, the mel spectrogram may be separated for each RGB channel or may be separated for each channel according to another criterion. The depthwise convolution layer may perform convolution for each single channel. For example, the depthwise convolution layer may extract an intermediate feature vector by performing convolution for each single channel using a kernel of n×n size (where n is an integer greater than or equal to 1). Here, the extracted intermediate feature vector may have a spatial characteristic. As described above, the amount of computation of the diagnostic model may be reduced by performing the convolution for each single channel rather than the entire image. In addition, the intermediate feature vectors extracted by performing the convolution for each channel are input to the pointwise convolution layer, and the pointwise convolution layer may perform convolution on the intermediate feature vectors using a kernel of 1×1 size. By the pointwise convolution layer, the output values of each channel of the mel spectrogram may be combined into one.

As described above, as the diagnostic model is based on the depthwise separable CNN algorithm, the amount of computation may be reduced and lighter compared to the model based on the existing convolution neural network algorithm. Due to this, the diagnostic model may be driven not only on the server but also on various devices (PC, mobile, etc.).

In addition, the values output through the depthwise convolution layer and the pointwise convolution layer in the diagnostic model may be variously configured. For example, the output value may indicate a probability that the power facility is in a specific state.

For example, when the diagnostic model is trained based on a training data set labeled as a normal state and a training data set labeled as a failure state, the output value of the diagnostic model may indicate a probability that the power facility is in a normal state and a probability that the power facility is in an abnormal state.

In addition, when the diagnostic model is trained based on the training data set labeled as the normal state, a training data set labeled as an arc state, a training data set labeled as a corona state, and a training data set labeled as a tracking state, the output value of the diagnostic model may include a probability that the power facility is in the normal state, a probability that the power facility is in the arc state, a probability that the power facility is in the corona state, and a probability that the power facility is in the tracking state.

Also, in another an embodiment, the diagnostic model may be generated based on a long short term memory (LSTM). The LSTM is to compensate for the long-term dependency problem of a general recurrent neural network (RNN), and by adding an input gate, an erase gate, and an output gate to a memory cell of a hidden layer, unnecessary values may be deleted from the inside of the diagnostic model, and important values may be set. In this case, the input data may be frequency data acquired by Fourier transforming the ultrasonic signal. Since the frequency data for the ultrasonic signal has frequency information for a relatively long time, when the diagnostic model is based on a general RNN, the accuracy of the diagnostic result may decrease. Accordingly, in order to improve the accuracy of the diagnostic result, the diagnostic model may be generated based on the LSTM. Of course, the present disclosure is not limited thereto, and the diagnostic model may be generated based on various algorithms such as a CNN, an RNN, a convolution recurrent neural network (CRNN), a spatial transformer network (STN), and a gated recurrent unit (GRU).

Referring back to FIG. 12, in step S230, the diagnostic device may acquire the diagnostic data for the power facility based on the diagnostic model.

In an embodiment, the diagnostic data may include a diagnostic result by the diagnostic model, that is, information on whether the power facility is in a failure state and/or in a normal state. Also, the diagnostic data may include information on a probability that the power facility is in a failure state or a probability that the power facility is in a normal state. In addition, the diagnostic data may include information on whether a failure phenomenon such as arc, tracking, or corona has occurred in the power facility or information on a probability of such a failure phenomenon occurring.

Figure 14:
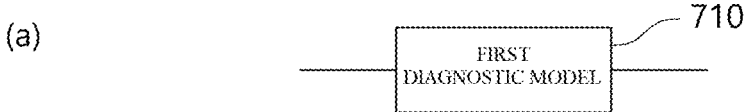
FIG. 14 is a diagram for describing a diagnostic model according to an embodiment.
Figure 14:
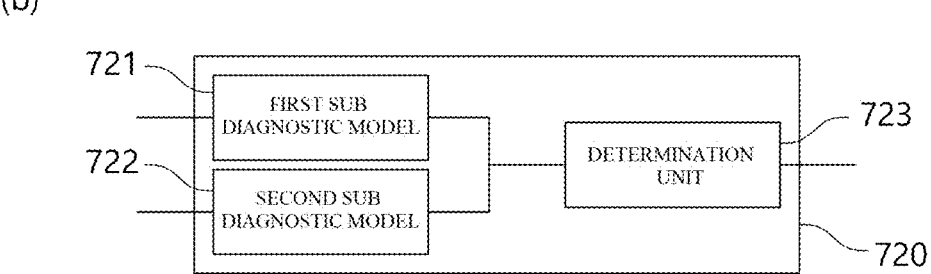
Figure 14:
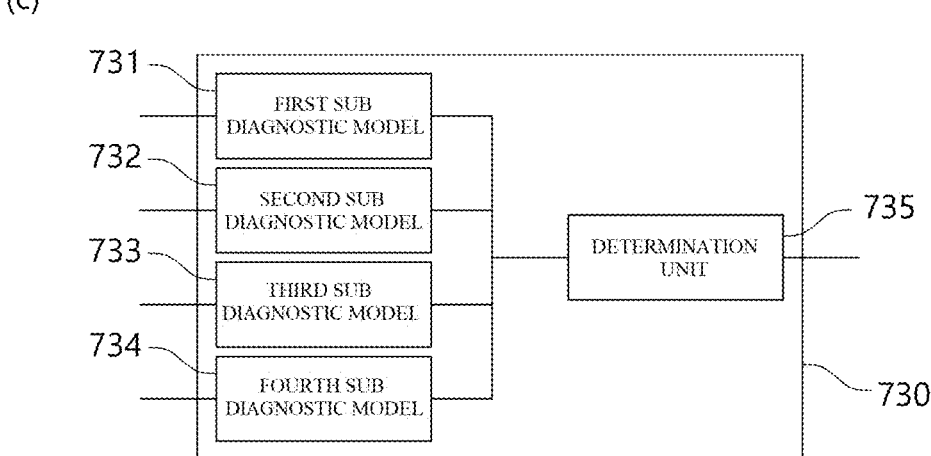

More specifically, referring to FIG. 14, FIG. 14 is a diagram for describing a diagnostic model according to an embodiment.

Referring to FIG. 14, as in FIG. 14A, a first diagnostic model 710 may be pre-trained based on a training data set with a label indicating that the power facility is in a failure state and a training data set with a label indicating that the power facility is in a normal state. In addition, according to an embodiment, the training data set with the label indicating that the power facility is in a failure state may include the training data set with a label indicating that the power facility is in the arc state, the training data set with a label indicating that the power facility is in the tracking state, and the training data set with a label indicating that the power facility is in the corona state.

Also, the first diagnostic model 710 may include the above-described neural network (e.g., the above-described depthwise-separable convolution neural network). When the input data (e.g., a mel spectrogram in which the ultrasonic signal is processed) is input to the first diagnostic model 710, a diagnostic result including a final diagnosis state (results of whether the power facility is in the failure condition, the normal condition, or the type of failure condition) indicating the state of the power facility corresponding to the input data may be output from the first diagnostic model 710. In addition, the diagnostic result may include information on the probability that the power facility is in the arc state, the probability that the power facility is in the corona state, the probability that the power facility is in the tracking state, the probability that the power facility is in the failure state, and/or the probability that the power facility is in the normal state.

Also, as in FIG. 14B, the second diagnostic model 720 may include a first sub diagnostic model 721, a second sub diagnostic model 722, and a determination unit 723. In addition, each of the first sub diagnostic model 721 and the second sub diagnostic model 722 may include the above-described neural network (e.g., the above-described depthwise-separable convolution neural network). In this case, the first sub diagnostic model 721 may be pre-trained based on the training data set with the label indicating that the power facility is in the failure state, and the second sub diagnostic model 722 may be pre-trained based on the training data set with the label indicating that the power facility is in the normal state. In addition, according to an embodiment, the training data set with the label indicating that the power facility is in a failure state may include the training data set with the label indicating that the power facility is in the arc state, the training data set with the label indicating that the power facility is in the tracking state, and the training data set with the label indicating that the power facility is in the corona state. Accordingly, when the input data is input to the first sub diagnostic model 721, the first sub diagnostic result indicating the probability that the power facility corresponding to the input data is in the failure state may be output to the first sub diagnostic model 721. Also, according to an embodiment, the first sub diagnostic result may include the probability that the power facility is in the arc state, the probability that the power facility is in the corona state, and the probability that the power facility is in the tracking state.

In addition, when the input data is input to the second sub diagnostic model 722, the second sub diagnostic result indicating the probability that the power facility corresponding to the input data is in the normal state may be output to the second sub diagnostic model 722. The determination unit 723 may determine whether the power facility corresponding to the input data is in the failure state and/or the type of the failure state based on the first sub diagnostic result output from the first sub diagnostic model 721 and the second sub diagnostic result output from the second sub diagnostic model 722, and acquire the diagnostic result including the final diagnostic state (results of whether the power facility is in the failure state or the normal state, or the type of the failure state), the probability that the power facility is in the arc state, the probability that the power facility is in the corona state, the probability that the power facility is in the tracking state, the probability that the power facility is in the failure state, and/or the probability that the power facility is in the normal state.

In addition, as in FIG. 14C, the third diagnostic model 730 may include a first sub diagnostic model 731, a second sub diagnostic model 732, a third sub diagnostic model 733, and a fourth sub diagnostic model 734. Each of the first sub diagnostic model 731, the second sub diagnostic model 732, the third sub diagnostic model 733, and the fourth sub diagnostic model 734 may include the above-described neural network (e.g., the above-described depthwise-separable convolution neural network).

The first sub diagnostic model 731 may be pre-trained based on the training data set with the label indicating that the arc occurs in the power facility, and the second sub diagnostic model 732 may be pre-trained based on the training data with the label indicating that the corona occurs in the power facility. In addition, the third sub diagnostic model 733 may be pre-trained based on the training data set with the label indicating that the tracking occurs in the power facility, and the fourth sub diagnostic model 734 may be pre-trained based on the training data with the label indicating that the power facility is in the normal state. Accordingly, when the input data is input to the first sub diagnostic model 731, the first sub diagnostic result indicating the probability that the arc occurs in the power facility corresponding to the input data may be output to the first sub diagnostic model 731, and when the input data is input to the second sub diagnostic model 732, the second sub diagnostic result indicating the probability that the corona occurs in the power facility corresponding to the input data may be output to the second sub diagnostic model 732. In addition, when the input data is input to the third sub diagnostic model 733, the third sub diagnostic result indicating the probability that the tracking occurs in the power facility corresponding to the input data may be output to the third sub diagnostic model 733, and when the input data is input to the fourth sub diagnostic model 734, the fourth sub diagnostic result indicating the probability that the power facility corresponding to the input data is in the normal state may be output to the fourth sub diagnostic model 734. The determination unit 735 may determine whether the power facility corresponding to the input data is in the failure state and/or the type of the failure state based on the first sub diagnostic result output from the first sub diagnostic model 731, the second sub diagnostic result output from the second sub diagnostic model 732, the third sub diagnostic result output from the third sub diagnostic model 733, and the fourth sub diagnostic result output from the fourth sub diagnostic model 734, and acquire the diagnostic result including the final diagnostic state (results of whether the power facility is in the failure state or the normal state, or the type of the failure state), the probability that the power facility is in the arc state, the probability that the power facility is in the corona state, the probability that the power facility is in the tracking state, the probability that the power facility is in the failure state, and/or the probability that the power facility is in the normal state.

The diagnostic device may provide information on diagnostic data based on the diagnostic result.

Further, in an embodiment, the diagnostic device may acquire, from the above-described ultrasonic acquisition device, image information indicating the state of the exterior of the power facility, information on the temperature of the power facility (for example, infrared image information on the temperature difference between when the power facility is in the normal state and in the failure state), information on the humidity of the power facility, distance information between the ultrasonic acquisition device and the power facility, and location information of the power facility (for example, global positioning system (GPS) information of the ultrasonic acquisition device when acquiring the ultrasonic signal of the power facility).

In addition, the diagnostic data may include information obtained from the ultrasonic acquisition device and results output by the diagnostic model.

Figure 15:
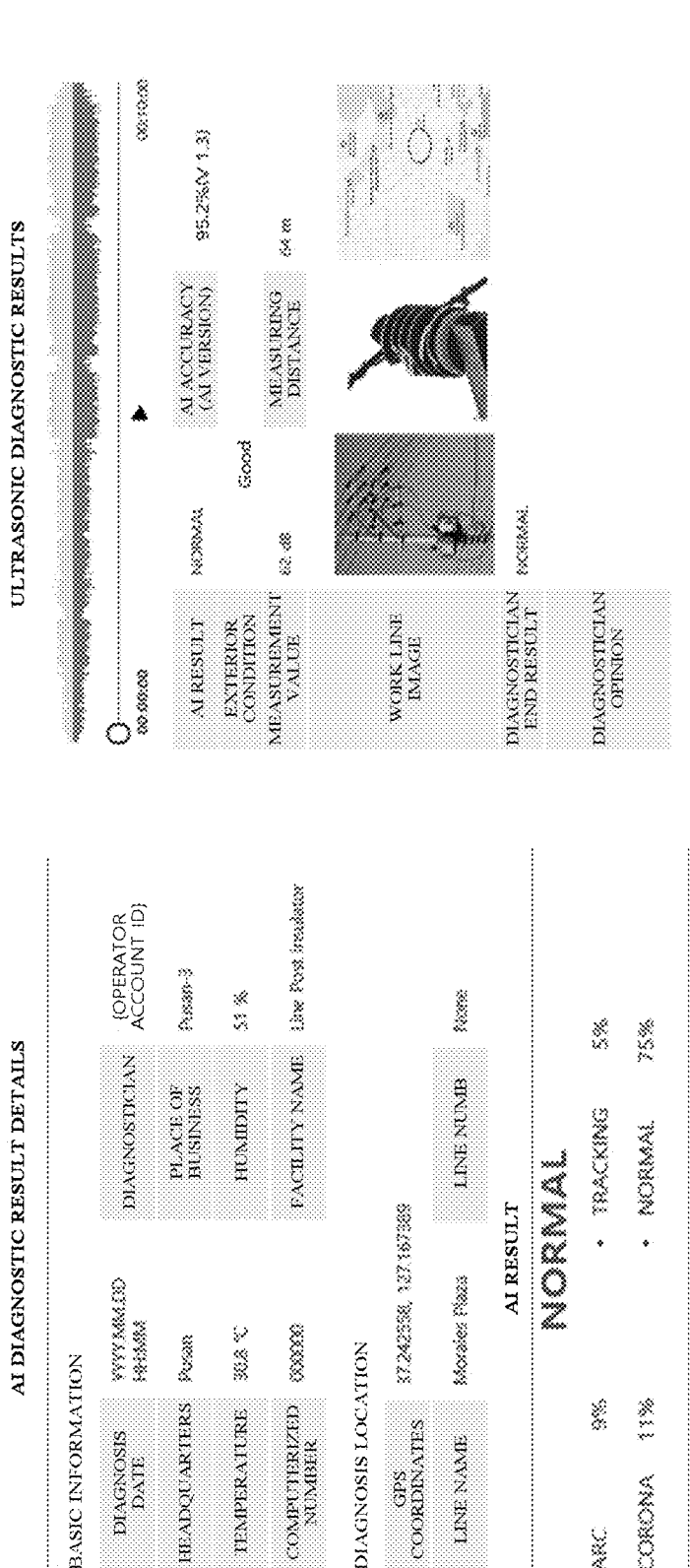
FIG. 15 is a diagram for describing exemplary diagnostic data according to an embodiment.

For example, FIG. 15 is a diagram for explaining exemplary diagnostic data according to an embodiment.

Referring to FIG. 15, the diagnostic device may generate diagnostic data as illustrated in FIG. 15. The diagnostic data may include a diagnosis date, a diagnostician, a diagnostician's headquarters, a diagnostician's place of business, a temperature of a diagnostic facility, a humidity of a diagnostic facility, an identification number of a diagnostic facility, a facility name of a diagnostic facility, and location information of a diagnostic facility. In addition, the diagnostic data may include information on the final diagnostic state of the diagnostic facility according to the diagnostic model and the probability of each state.

Also, the diagnostic data may include accuracy of the diagnostic model, decibel information of the ultrasonic signal, distance information between the ultrasonic acquisition device and the power facility, an image of the exterior of the power facility, and map information of the power facility.

In addition, the diagnostic device may receive information on a state of an exterior of a power facility, a diagnostic result of a diagnostician, and a diagnostician's comment from a diagnostician, and may include the received information in the diagnostic data.

Various embodiments of the present disclosure may be implemented by software including instructions stored in a machine-readable storage medium (for example, a computer-readable storage medium). A machine may be a device that invokes the stored instruction from the storage medium, may be operated depending on the invoked instruction, and may include the electronic device according to the disclosed embodiments. In a case where a command is executed by the processor, the processor may directly perform a function corresponding to the command or other components may perform the function corresponding to the command under control of the processor. The command may include codes created or executed by a compiler or an interpreter. The machine-readable storage medium may be provided in the form of a non-transitory storage medium. Here, the term "non-transitory storage medium" means that the storage medium is tangible without including a signal, and does not distinguish whether data is semi-permanently or temporarily stored in the storage medium. For example, the "non-transitory storage medium" may include a buffer in which data is temporarily stored.

According to an embodiment, the methods according to the diverse embodiments disclosed in the document may be included and provided in a computer program product. The computer program product may be traded as a product between a seller and a purchaser. The computer program product may be distributed in the form of a storage medium (for example, a compact disc read only memory (CD-ROM)) that may be read by the machine or online through an application store (for example, PlayStore™). In the case of online distribution, at least a portion of the computer program product (for example, a downloadable app) may be at least temporarily stored in the storage medium such as a memory of a server of a manufacturer, a server of an application store, or a relay server, or may be temporarily generated.

According to an embodiment of the present disclosure, by performing failure diagnosis of a power facility using artificial intelligence, it is possible to reduce a time required for failure diagnosis and improve the accuracy of the failure diagnosis.

Effects of the present disclosure are not limited to the above described effects, and effects that are not described will be clearly understood by those skilled in the art to which the present disclosure pertains from the present specification and the accompanying drawings.

Although embodiments have been described above with reference to limited embodiments and drawings, various modifications and alternations are possible by those of ordinary skill in the art from the above description. For example, appropriate results can be achieved by performing the described techniques in a different order than the described method, and/or by combining components of the described systems, structures, devices, circuits, etc., or combining them in a different manner than the described method, or replacing or substituting them with other components.

Therefore, other implementations, other embodiments, and equivalents to the claims also fall within the scope of the claims described below.

What is claimed is:

1. A method of diagnosing a power facility using artificial intelligence, the method comprising:

acquiring a plurality of ultrasonic signals of the power facility;

generating a plurality of mel spectrograms based on the plurality of ultrasonic signals, wherein each of the plurality of mel spectrograms is in a form of an image;

creating a plurality of training data sets by labeling each of the plurality of mel spectrograms using an annotation tool, wherein the labeling comprises:

displaying, simultaneously via a user interface of the annotation tool, a waveform of an ultrasonic signal to be labeled and a mel spectrogram corresponding to the ultrasonic signal to be labeled, receiving, via the user interface, a selection of a type for a labeling item, wherein the type is selected from a group consisting of an arc state, a tracking state, a corona state, and a normal state, receiving, via the user interface, a setting of a position and a length for the labeling item on the waveform or the mel spectrogram, separating a portion of the ultrasonic signal to be labeled according to the set position and length, and independently storing original data comprising the separated portion of the ultrasonic signal, refined data comprising a waveform or a mel spectrogram corresponding to the separated portion, and labeling data in which the labeling item is added to the original data and the refined data;

training a diagnostic model based on the plurality of training data sets, wherein the diagnostic model is based on a convolution neural network algorithm;

inputting a new mel spectrogram generated from a new ultrasonic signal into the trained diagnostic model; and acquiring diagnostic data for the power facility based on an output of the trained diagnostic model.

2. The method of claim 1, wherein the generating of the plurality of mel spectrograms based on the plurality of ultrasonic signals comprising:

performing pre-emphasis on the plurality of ultrasonic signals;

performing sampling and windowing on the plurality of ultrasonic signals on which the pre-emphasis is performed to generate a plurality of frames;

performing a Fourier transform on the plurality of frames to generate frequency data, and generating a power spectrum based on the frequency data; and generating the plurality of mel spectrograms based on the power spectrum.

3. The method of claim 2, wherein the Fourier transform is performed using a short time Fourier transform (STFT) algorithm.

4. The method of claim 1, wherein the diagnostic model is based on a depthwise-separable convolution neural network algorithm.

5. The method of claim 4, wherein:

the diagnostic model includes a depthwise convolution layer and a pointwise convolution layer;

in the diagnostic model, the plurality of mel spectrograms are divided for each of a plurality of channels;

the depthwise convolution layer performs convolution for each of the plurality of channels and extracts an intermediate feature vector;

the pointwise convolution layer performs convolution on the intermediate feature vectors using a kernel having a size of 1×1 and outputs an output value; and the diagnostic model generates a diagnostic result for the power facility based on the output value.

6. The method of claim 5, wherein the diagnostic result includes a probability that the power facility is in an arc state, a probability that the power facility is in a tracking state, a probability that the power facility is in a corona state, and a probability that the power facility is in a normal state, in the acquiring of the diagnostic data for the power facility based on the diagnostic model, the state of the power facility is determined based on the probability that the power facility is in the arc state, the probability that the power facility is in the tracking state, the probability that the power facility is in the corona state, and the probability that the power facility is in the normal state, and the state of the power facility is included in the diagnostic result.

7. The method of claim 6, wherein the diagnostic data includes the diagnostic result and additional information, and the additional information includes at least one of identification information of the power facility, information on a location of the power facility, and information on a temperature of the power facility.

8. A non-transitory computer-readable recording medium having recorded thereon a program for performing the method of claim 1.

9. A power facility diagnostic device using artificial intelligence, comprising:

a communication unit;

a display; and a control unit, wherein the control unit is configured to:

acquire a plurality of ultrasonic signals of the power facility through the communication unit;

generate a plurality of mel spectrograms based on the plurality of ultrasonic signals;

create a plurality of training data sets by labeling each of the plurality of mel spectrograms using an annotation tool by:

displaying, simultaneously via a user interface of the annotation tool on the display, a waveform of an ultrasonic signal to be labeled and a mel spectrogram corresponding to the ultrasonic signal to be labeled, receiving, via the user interface, a selection of a type for a labeling item, wherein the type is selected from a group consisting of an arc state, a tracking state, a corona state, and a normal state, receiving, via the user interface, a setting of a position and a length for the labeling item on the waveform or the mel spectrogram, separating a portion of the ultrasonic signal to be labeled according to the set position and length, and independently storing original data comprising the separated portion of the ultrasonic signal, refined data comprising a waveform or a mel spectrogram corresponding to the separated portion, and labeling data in which the labeling item is added to the original data and the refined data;

train a diagnostic model based on the plurality of training data sets, wherein the diagnostic model is based on a convolution neural network algorithm;

input a new mel spectrogram generated from a new ultrasonic signal into the trained diagnostic model; and acquire diagnostic data for the power facility based on an output of the trained diagnostic model.

* * * * *